United States Patent [19]
Kim et al.

[11] Patent Number: 5,914,626
[45] Date of Patent: Jun. 22, 1999

[54] VOLTAGE CLAMPING CIRCUIT FOR SEMICONDUCTOR DEVICES

[75] Inventors: Hong-Beom Kim, Kyungki-Do; Sang-Seok Kang, Suwon; Byung-Heon Kwak, Suwon; Yong-Jin Park, Suwon, all of Rep. of Korea

[73] Assignee: Samsung Electronics, Co., Ltd., Suwon, Rep. of Korea

[21] Appl. No.: 08/770,627

[22] Filed: Dec. 19, 1996

[30] Foreign Application Priority Data

Dec. 20, 1995 [KR] Rep. of Korea ............... 52597/1995

[51] Int. Cl.⁶ .................................................. H03K 5/08
[52] U.S. Cl. ..................... 327/309; 327/308; 327/314; 327/321; 327/325
[58] Field of Search ............................. 327/306, 308, 327/309, 315, 318, 320, 321, 324, 325, 493, 504, 525, 583

[56] References Cited

U.S. PATENT DOCUMENTS 5,361,001 11/1994 Stolfa ........................................ 327/525
5,450,030 9/1995 Shin et al. ................................ 327/525

*Primary Examiner*—Timothy P. Callahan
*Assistant Examiner*—Jeffrey Zweizig
*Attorney, Agent, or Firm*—Marger Johnson & McCollom, P.C.

[57] ABSTRACT

A voltage clamping circuit for a semiconductor memory device which is capable of rapidly coping with the demand of the user. The voltage clamping circuit includes PMOS transistors connected in series between an external supply voltage terminal and a node on an output line of a DC voltage generator, a control PMOS transistor having a channel connected at both ends thereof respectively to the node on the output line and a node between the second and third ones of the series-connected PMOS transistors, and a pad connected to a control electrode of the control PMOS transistor. The pad is selectively connected to a supply voltage in a first state and to a ground voltage in a second state, thereby controlling a clamping interval of the clamping means to be variable. The first state is a state requiring a longer clamping interval than that of the second state.

5 Claims, 2 Drawing Sheets

2

VOLTAGE CLAMPING CIRCUIT FOR SEMICONDUCTOR DEVICES

BACKGROUND OF THE INVENTION

1. Field of the Invention

The present invention relates to semiconductor devices, and more particularly to a voltage clamping circuit for a semiconductor memory device adapted to clamp an output voltage from the semiconductor memory device to a desired level in a certain voltage variation interval of an external supply voltage.

2. Description of the Related Art

Semiconductor memory devices include a DC voltage generating circuit, such as an internal supply voltage generating circuit, incorporated in a chip in order to obtain a desired DC voltage for an internal operation of the chip. Typically, the output of such a DC voltage generating circuit is used as a bias voltage for an operation of the memory device. On the other hand, a separate test voltage is also required in a particular mode using a high voltage as in a burn-in test. In order to supply such a test voltage with a high voltage level, a test voltage generating circuit, which is designed differently from the above-mentioned DC voltage generating circuit, should be additionally incorporated in the chip. In other words, the chip should have both the DC voltage generating circuit for the application of a bias voltage and the test voltage generating circuit for a burn-in test operation. As a result, the semiconductor memory device degrades in integration degree. In order to solve this problem, a method has been proposed in which the output voltage of the DC voltage generating circuit, such as the internal supply voltage generating circuit, depends on the external supply voltage. In accordance with this method, the DC voltage generating circuit is controlled to clamp its output voltage to a desired level for the application of a bias voltage in a certain range of the external supply voltage while increasing the output voltage in proportion to the level of the external supply voltage when the external supply voltage is higher than a particular voltage level. In order to achieve such a control, a voltage clamping circuit is employed in semiconductor memory devices. Referring to FIG. 1, the waveform of an output voltage generated from the DC voltage generating circuit under the control of a voltage clamping circuit is best shown. In a particular range of an external supply voltage, for example, a range between voltage levels V1 and V2 in FIG. 1, the output voltage Vout of the DC voltage generating circuit is clamped to a voltage level Vc. On the other hand, the output voltage Vout increases in proportion to a variation in the external supply voltage when the external supply voltage is higher than the voltage level V2. Accordingly, when the level of the external supply voltage applied to the DC voltage generating circuit is in the interval between voltage levels V1 and V2, it supplies a bias voltage to circuits provided in a chip associated therewith. The DC voltage generating circuit also supplies a high-level voltage required for a test operation to the circuits of the chip when the level of the external supply voltage is higher than the voltage level V2.

However, such a voltage clamping circuit carries out a voltage clamping function in a fixed clamping range. In other words, the clamping range of the voltage clamping circuit can not be adjusted. It has often been required to use a voltage clamping circuit in which its clamping range is variable. Such a voltage clamping circuit has been realized in accordance with a fuse option adopted to semiconductor memory devices. Voltage clamping circuits utilizing such a fuse option are illustrated in FIGS. 2 and 3, respectively.

Referring to FIG. 2, four diodes 11 to 14 are connected in series between an external supply voltage terminal EVcc and a node Ni on the output line of a DC voltage generating circuit 10. Fuses 15 to 18 are coupled in parallel to the diodes 11 to 14, respectively. In the circuit shown in FIG. 2, the maximum clamping interval for an output voltage of the DC voltage generating circuit 10 corresponds to the sum of threshold voltages of the diodes 11 to 14. For example, when the threshold voltage of each diode is Vt, the maximum clamping interval, V1–V2, corresponds to 4Vt. Where it is desired to adjust the clamping interval from the maximum interval, some or all of the fuses 15 to 18 are cut. Accordingly, the clamping interval is determined in accordance with the number of cut fuses.

Referring to FIG. 3, four PMOS transistors 21 to 24 are connected in series between an external supply voltage terminal EVcc and a node N2 on the output line of a DC voltage generating circuit 20. Fuses 25 to 28 are coupled in parallel to the PMOS transistors 21 to 24, respectively. In the circuit shown in FIG. 3, the maximum clamping interval for an output voltage of the DC voltage generating circuit 20 corresponds to the sum of threshold voltages of the PMOS transistors 21 to 24. For example, when the threshold voltage of each diode is Vt, the maximum clamping interval, V1–V2, corresponds to 4Vt. Where it is desired to adjust the clamping interval from the maximum interval, some or all of the fuses 25 to 28 are cut in the same manner as in FIG. 2. Accordingly, the clamping interval is determined in accordance with the number of cut fuses, as in the case of FIG. 2.

As mentioned above, the conventional voltage clamping circuits of FIGS. 2 and 3 use fuses for the adjustment of the clamping interval. In other words, the clamping interval of the output voltage is adjusted in accordance with a fuse option. Some or all of the fuses are cut in accordance with the fuse option. Such a fuse option is conducted during fabricating semiconductor memory devices. That is, the fabrication of chips is completed after a number of processing steps, following the cutting of fuses, are conducted. For this reason, semiconductor memory devices having desired clamp intervals can be obtained only after a considerable period of time elapses from the point of time when the demand of the user is accepted. As a result, a variation in market may occur in the interval between the point of time when the demand of the user is accepted and the point of time when the semiconductor memory devices are obtained. Such a variation in market may cause severe damage to the manufacturer of the semiconductor memory devices.

SUMMARY OF THE INVENTION

Therefore, an object of the invention is to provide a semiconductor memory device capable of being elastically adapted to a variation in market.

Another object of the invention is to provide a voltage clamping circuit for a semiconductor memory device which is easily configurable to meet the requirements of the user.

In accordance with the present invention, these objects are accomplished through a voltage clamping circuit for a semiconductor memory device comprising: clamping means connected between an external supply voltage terminal and a node on an output line of a DC voltage generator, the clamping means including a desired number of clamping elements connected together in series; clamping control means having a channel connected between the node on the output line and a node between selected adjacent ones of the clamping elements, the clamping control means also having a control electrode connected to a pad; and the pad selectively connected to a first voltage in a first state and to a second voltage in a second state, thereby controlling a clamping interval of the clamping means to be variable.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
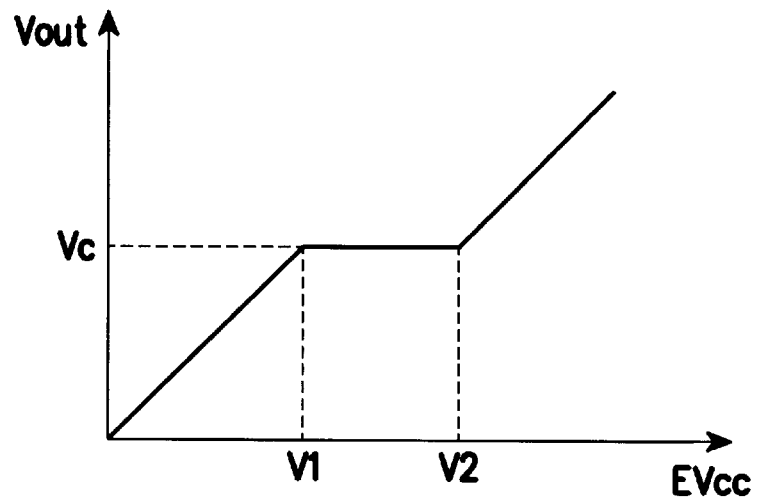
FIG. 1 is a waveform diagram of an output voltage generated from a DC voltage generating circuit in accordance with the operation of a voltage clamping circuit.
Figure 2:
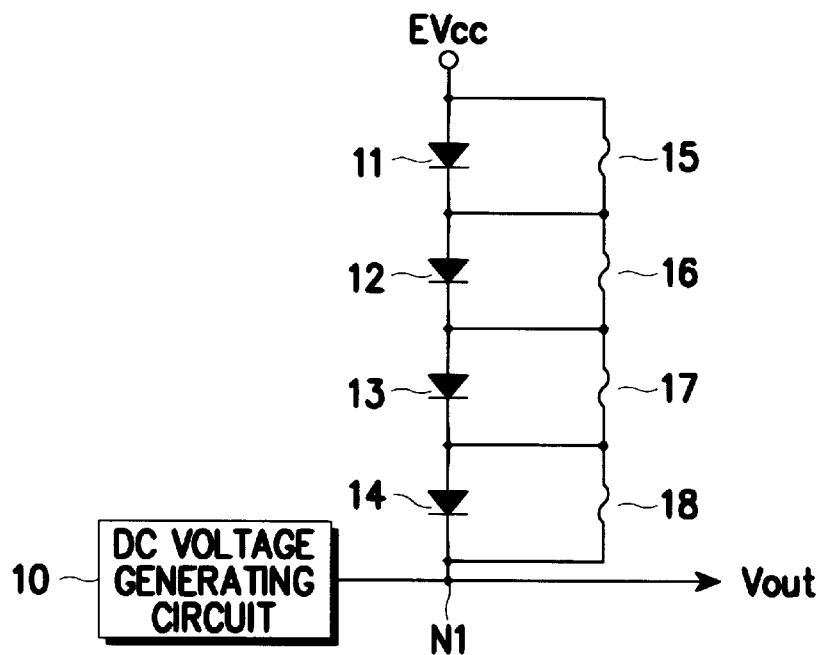
FIG. 2 is a circuit diagram of a conventional voltage clamping circuit.
Figure 3:
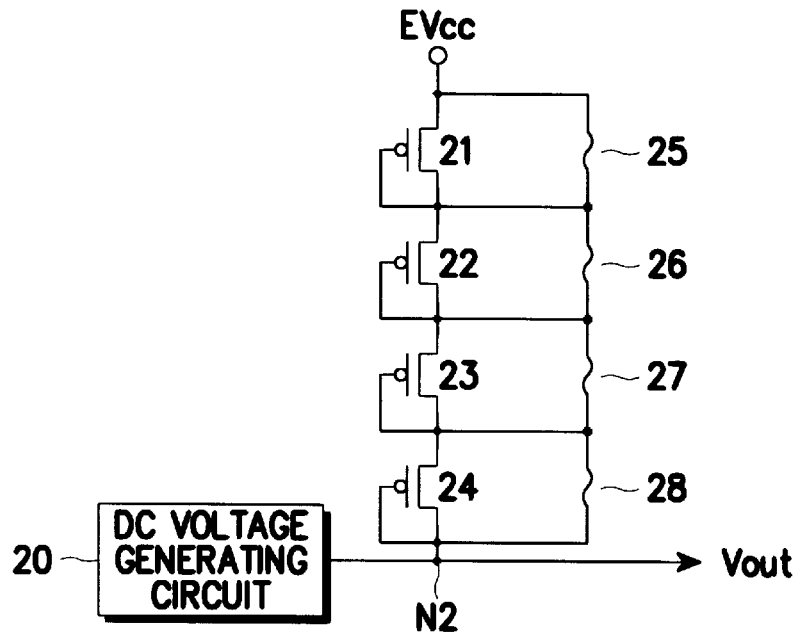
FIG. 3 is a circuit diagram of another conventional voltage clamping circuit.
Figure 4:
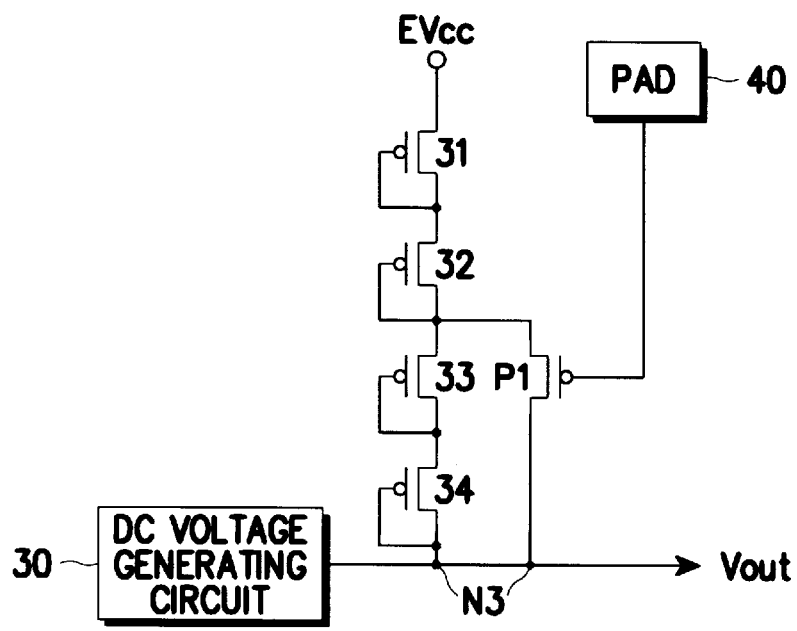
FIG. 4 is a circuit diagram of a voltage clamping circuit in accordance with an embodiment of the present invention.

FIG. 4 is a circuit diagram illustrating a voltage clamping circuit for a semiconductor memory device in accordance with an embodiment of the present invention.

Referring to FIG. 4, four PMOS transistors 31 to 34 are coupled in series between an external supply voltage terminal EVcc and a node N3 on the output line of a DC voltage generating circuit 30. Another PMOS transistor P1 is also coupled to the node N3 at one end of its channel. The PMOS transistor P1 is also connected at the other end of its channel to a node between the second and third PMOS transistors 32 and 33. The PMOS transistor P1 serves as a clamping control means. A pad 40 is coupled to the gate of the PMOS transistor P1. In the circuit shown in FIG. 4, the maximum clamping interval of an output voltage of the DC voltage generating circuit 30 may correspond to the sum of threshold voltages of the PMOS transistors 31 to 34.

In order to adjust the clamping interval between a first state, in which a longer clamping interval is required, and a second state, in which a shorter clamping interval is required, the pad is selectively connected to different voltages. That is, the pad 40 is connected to a first voltage, namely, a supply voltage terminal, in the first state whereas it is connected to a second voltage, namely, a ground voltage terminal, in the second state. Accordingly, the PMOS transistor P1 turns off in the first state whereas it turns on in the second state. As a result, the clamping interval corresponds to 4Vt (Vt: the threshold voltage of each PMOS transistor) in the first state whereas it is reduced to 2Vt in the second state. For such an adjustment for the clamping interval, it is desirable to design the PMOS transistor P1 to have a very small threshold voltage.

By virtue of such a clamping circuit having the above-mentioned configuration in accordance with the present invention, it is possible to realize semiconductor memory devices which can be elastically adapted to a change in market. Since a bonding option using a bonding pad is utilized in accordance with the present invention, the adjustment of the clamping interval can be conducted at the step of bonding pads and leads in the procedure of fabricating a chip. Since such a wire bonding step is conducted just before the assembling of the chip, it is possible to immediately accept the demand of the user. Accordingly, the present invention realizes a voltage clamping circuit for a semiconductor memory device which can immediately cope with the demand of the user and a variation in market. In the illustrated embodiment of the present invention, the clamping control means has been described as consisting of one PMOS transistor, P1, and one pad, 40 to vary the clamping interval between two states. However, the clamping interval may vary among an increased number of states by using an increased number of PMOS transistors respectively connected to pads. Although the PMOS transistor P1 is connected at its gate to the pad in the illustrated embodiment of the present invention, it may be connected at the gate to an optional control circuit, if desired.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A voltage clamping circuit for use in a semiconductor memory device having an internal DC voltage generator coupled to receive an external supply voltage, the clamping circuit comprising:

clamping means connected between an external supply voltage terminal and a first node on an output line of the DC voltage generator, the clamping means including a desired number of clamping elements connected together in series;

clamping control means having a channel connected between the first node on the output line and a second node between selected adjacent ones of the clamping elements, the clamping control means also having a control electrode; and a pad connected to the control electrode and wire bonded to an external pin of the semiconductor memory device with a single voltage on the pin for selecting and fixing a clamping interval of the clamping means without the use of a fuse.

2. The voltage clamping circuit in accordance with claim 1, wherein the external pin is one of a supply voltage terminal and a ground voltage terminal.

3. The voltage clamping circuit in accordance with claim 1, wherein the clamping control means includes a MOS transistor.

4. A method of selecting a clamping voltage range in a semiconductor memory device having an internal DC voltage generator coupled to receive an external supply voltage, the method comprising:

providing a plurality of diode elements arranged in series between the external supply voltage source and an output of the internal DC voltage generator so as to form a clamping circuit having a clamping voltage range proportional to the number of diode elements in the series;

controllably bypassing one or more of the diode elements, thereby selecting a desired clamping voltage range in response to a predetermined state of a control signal; and connecting a pad of the device to a constant voltage source to provide the control signal, thereby selecting and fixing the clamping voltage range at a wire bonding stage of the device manufacturing process to allow rapid response to customer demand for the selected clamping voltage range.

5. A method according to claim 4 wherein said diode elements comprise MOS transistors.

* * * * *

UNITED STATES PATENT AND TRADEMARK OFFICE
CERTIFICATE OF CORRECTION

PATENT NO.  : 5,914,626  
DATED       : June 22, 1999  
INVENTOR(S) : Kim et al.

Page 1 of 1

It is certified that error appears in the above-identified patent and that said Letters Patent is hereby corrected as shown below:

Column 2,  
Line 3, "Ni" should read -- N1 --.

Signed and Sealed this

Seventh Day of May, 2002

Attest:

JAMES E. ROGAN  
*Attesting Officer*     *Director of the United States Patent and Trademark Office*